(12) United States Patent
Cai et al.

(10) Patent No.: US 9,620,458 B2
(45) Date of Patent: Apr. 11, 2017

(54) PHOTOLITHOGRAPHY ALIGNMENT MARK STRUCTURES, SEMICONDUCTOR STRUCTURES, AND FABRICATION METHOD THEREOF

(71) Applicant: Semiconductor Manufacturing International (Shanghai) Corporation, Shanghai (CN)

(72) Inventors: Boxiu Cai, Shanghai (CN); Yi Huang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/861,591

(22) Filed: Sep. 22, 2015

(65) Prior Publication Data

US 2016/0093574 A1    Mar. 31, 2016

(30) Foreign Application Priority Data

Sep. 26, 2014   (CN) ............... 2014-10505490

(51) Int. Cl.
| | | |
|---|---|---|
| B44C 1/22 | (2006.01) | |
| H01L 23/544 | (2006.01) | |
| G02B 5/18 | (2006.01) | |
| H01L 21/3065 | (2006.01) | |

(Continued)

(52) U.S. Cl.
CPC .......... *H01L 23/544* (2013.01); *G02B 5/1823* (2013.01); *G02B 5/1857* (2013.01); *G03F 7/20* (2013.01); *H01L 21/3065* (2013.01); *H01L 21/3085* (2013.01); *H01L 21/3086* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ............... H01L 23/544; H01L 21/3086; H01L 21/3085; H01L 2924/0002; H01L 21/3065; H01L 2223/5442; H01L 2223/54426; H01L 2223/54453; G02B 5/1823; G02B 5/1857
USPC ..... 216/40, 41, 47, 49; 430/5, 302, 313, 314
See application file for complete search history.

(56) References Cited

U.S. PATENT DOCUMENTS

| | | | | |
|---|---|---|---|---|
| 7,880,880 B2* | 2/2011 | Van Bilsen | ........... | G03F 9/7046 250/237 G |
| 2013/0177840 A1* | 7/2013 | Gabor | ........... | G03F 1/42 430/5 |
| 2013/0208279 A1* | 8/2013 | Smith | ........... | G01B 11/26 356/401 |

\* cited by examiner

*Primary Examiner* — Lan Vinh
(74) *Attorney, Agent, or Firm* — Anova Law Group, PLLC

(57) ABSTRACT

A method is provided for fabricating a photolithography alignment mark structure. The method includes providing a substrate; thrilling a first grating, a second grating, a third grating and a fourth grating in the substrate; forming a photoresist layer on a surface of the substrate; obtaining a first alignment center along a first direction and a second alignment center along a second direction based on the first grating and the fourth grating, respectively; providing a mask plate having a fifth grating pattern and a sixth grating pattern; aligning the mask plate with the substrate by using the first alignment center as an alignment center along the first direction and the second alignment center as an alignment center along the second direction; reproducing the fifth grating pattern and the sixth grating pattern in the photoresist layer; and forming a fifth grating and a sixth grating on the substrate by removing a portion of photoresist layer.

12 Claims, 13 Drawing Sheets

(51) Int. Cl.
*H01L 21/308* (2006.01)
*G03F 7/20* (2006.01)

PHOTOLITHOGRAPHY ALIGNMENT MARK STRUCTURES, SEMICONDUCTOR STRUCTURES, AND FABRICATION METHOD THEREOF

CROSS-REFERENCES TO RELATED APPLICATIONS

This application claims the priority of Chinese patent application No. 201410505490.0, filed on Sep. 26, 2014, the entirety of which is incorporated herein by reference.

FIELD OF THE INVENTION

The present invention generally relates to the field of semiconductor manufacturing technology and, more particularly, relates to a photolithographic alignment mark structure and the fabricating process thereof.

BACKGROUND

With the development of semiconductor technology, semiconductor chip area is getting smaller and smaller while the line width inside semiconductor chip is also shrinking. Therefore, semiconductor process capability is facing a growing challenge, the precision of the process and the control of process variations also became increasingly important. Among the processes for fabricating semiconductor chips, photolithography technique is one of the most important processes. Photolithography is a technological process to transfer mask patterns of a mask plate onto a wafer through a series of steps including alignment, exposure, development, etc. Therefore, the quality of the photolithography process directly affects the performance of the ultimately formed semiconductor chip.

During photolithography process, to accurately transfer a mask pattern on a mask plate onto a wafer, a key step is to align the mask plate with the wafer, that is, to calculate the position of the mask plate with respect to the wafer to meet the requirements of registration accuracy. As the feature size getting smaller and smaller, the requirement of registration accuracy and thereby the requirement of alignment accuracy also becomes more and more strict.

In current technology, there are two methods for performing photolithography alignment. One method is a through the lens (TTL) alignment technique: using a laser beam to light up an alignment mark on a mask plate and simultaneously imaging the alignment mark onto the surface of a wafer through an objective lens; then moving the wafer base station to let a reference mark on the wafer base station scan the image of the alignment mark; in the meantime, sampling the intensity of the image and finally reaching the correct alignment position when the detector receives a maximum intensity. The other method is an off-axis (OA) alignment technique: first, by using an off-axis alignment system to gauge multiple alignment marks on wafer and reference marks on a reference plate located on a wafer base station, alignment between the wafer and the wafer base station is thus realized, then the reference marks on the wafer base station is aligned with the alignment marks on a mask plate so that the alignment between the mask plate and the wafer base station is also realized. As such, the relative position of the mask plate with respect to the wafer is determined and alignment between the mask plate and the wafer is then realized.

According to the present disclosure, at present, most of the mainstream photolithography facilities use grating diffraction. Grating diffraction refers to that, when a light beam is illuminated on a grating type alignment mark on a wafer, the beam is then diffracted and the diffracted light carries all the information about the alignment mark. The multi-level diffracted light spread out from the grating alignment mark from different angles. After using a spatial filter to filter out the zeroth-level light, the interference image of the ±n levels of the diffracted light on the reference plane is collected. As the feature size is getting smaller and smaller, an interference image of more levels of the diffracted light on the reference plane may be collected. Further, using a corresponding reference grating to scan the image along a certain direction and the signal simultaneously detected by a photoelectric detector. After signal processing, the position of the alignment center is then determined. The position of the alignment center may be defined in the coordinate system of the wafer base station. Then, the position of the alignment center is aligned with the alignment marks on the mask plate to realize the alignment between the mask plate and the wafer.

Grating diffraction may be used in a double exposure type double patterning process. Referring to FIG. 1, a first grating 11 along the x-axis and a second grating 12 along the y-axis are formed in a substrate 1. The first grating 11 is an alignment mark for the direction along the x-axis while the second grating is an alignment mark for the direction along the y-axis. Referring to FIG. 2, a device layer (not shown) is formed on the substrate 1 and then a photoresist layer 2 is formed on the surface of the device layer. Both the first grating 11 and the second grating 12 are covered by the photoresist layer 2 and cannot be seen from the top, thus they are represented by dashed lines. Referring to FIG. 3, using grating diffraction, the first alignment center x0 along, the x-axis direction is obtained based on the first grating 11 while the second alignment center y0 along the y-axis direction is obtained based on the second grating 12. Further, reference marks on a mask plate which contains a first device pattern 3 are then aligned with the first alignment center x0 and the second alignment center y0, respectively. Afterwards, the photoresist layer 2 is exposed for the first time to define the first device pattern 3. The first device pattern 3 includes a number of parallel and equally spaced first strip lines 31.

Referring to FIG. 4, reference marks on a mask plate which contains a second device pattern 4 are aligned with the first alignment center x0 and the second alignment center y0, respectively. The second device pattern 4 includes a number of second strip lines 42 parallel to the first strip lines 31. Every neighboring pair of first strip lines 31 correspond to a second strip line 42, and all the first strip lines 31 and the second strip lines 42 are arranged in a staggered way and are spaced equally. Then the photoresist layer 2 is exposed for the second time to define the first device pattern 4. Finally, the photoresist layer 2 is developed, and then the developed photoresist layer 2 is used as a mask to etch the device layer and thus form a semiconductor structure. The ultimately formed semiconductor structure includes a number of the first strip lines 31 and a number of the second strip lines 42.

However, referring to FIG. 3 and FIG. 4, during, the first exposure process, the position of the first device pattern 3, with respect to the first alignment center x0, may have an overlay shift. Correspondingly during the second exposure process, the position of the second device pattern 4, with respect to the second alignment center y0, may also have an overlay shift. Therefore, as shown in FIG. 4, the distances between each second strip line 42 and the neighboring two first strip lines 31 of the second strip line 42 may not be the same, i.e. w1≠w2. As such, on one hand, the second device pattern 4 may have an overlay shift with respect to the first alignment center x0, thus the actual position of the second device pattern 4 on the substrate may also have an alignment error with respect to its intended position; on the other hand, due to the two overlay shifts, precise alignment between the first strip lines 31 and the second strip lines 42 may not be able to achieve, thus reducing the registration accuracy between the second strip lines 42 and the first strip lines 31. All of the above factors further affect subsequent semiconductor fabrication processes and the performance of the semiconductor structure containing the second strip lines 42 and the first strip lines 31.

In view of the above problems, the present disclosure provides a new alignment strategy to reduce the alignment error and improve the performance of semiconductor structures formed by a double exposure type double patterning process using grating diffraction.

BRIEF SUMMARY OF THE DISCLOSURE

The present disclosure includes a method for forming a photolithography alignment mark structure. The method includes providing a semiconductor substrate; forming a first grating, a second grating, a third grating and a fourth grating in the substrate; and forming a photoresist layer on a surface of the substrate. The method also include obtaining a first alignment center along a first direction and a second alignment center along a second direction based on the first grating and the fourth grating, respectively, by using grating diffraction, providing a mask plate having a fifth grating pattern and a sixth grating pattern on the mask plate; aligning the mask plate with the substrate by using the first alignment center as an alignment center along the first direction and the second alignment center as an alignment center along the second direction. The method further includes reproducing the fifth grating pattern and the sixth grating pattern in the photoresist layer on the substrate through an exposure process; and forming a fifth grating and a sixth grating on the surface of the substrate by removing the portion of denatured photoresist layer.

The present disclosure also includes a photolithography alignment mark structure. The photolithography alignment mark structure includes a substrate and a first grating, a second grating, a third grating, and a fourth grating formed in the substrate. The photolithography alignment mark structure also includes a fifth grating and a sixth grating formed on a surface of the substrate. The first grating, the second grating, and the third grating formed in the substrate are along a first direction; the fourth grating formed in the substrate is along a second direction; the first direction and the second direction are perpendicular to each other; the fifth grating and the sixth grating formed on the mask plate are along the first direction; the grating constant of the first grating is smaller than the grating constant of the second grating; and the second grating, the third grating, the fifth grating, and the sixth grating, have a same grating constant.

The present disclosure also includes a method for fabricating semiconductor structures using a photolithography alignment mark structure. The method includes providing a semiconductor substrate having the photolithography alignment mark structure; forming a device layer on the surface of the substrate to cover the substrate and the photolithography alignment mark structure; and forming a photoresist layer on the surface of the device layer. The method also includes using grating diffraction to obtain a first alignment center x0 along a first direction based on a first grating, a third alignment, center x1 along the first direction based on a second grating and a fifth grating, and a fourth alignment center x2 along the first direction based on a third grating and a sixth grating; and performing a first exposure to define a first device pattern in the photoresist layer by using the first alignment center x0 as an alignment center along the first direction for the alignment prior to the first exposure process. The first device pattern includes a number of parallel first strip lines along the first direction. The method further includes performing a second exposure to define a second device pattern in the photoresist layer by using $x'=((x1+x2)/2+x0)/2$ as the alignment center along the first direction for the alignment prior to the second exposure process, where the second device pattern includes a number of parallel second strip lines along the first direction, and the second strip lines are interlaced with the first strip lines.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Referring to FIG. 1-4, a detailed description of a representative double exposure type double patterning process of the prior an has been provided in above background section. In the existing double exposure type double patterning process, an overlay shift after each exposure process may be unavoidable and the two overlay shifts may further affect subsequent semiconductor fabrication processes and the performance of the ultimately formed semiconductor structure.

In view of the problems described above, the disclosed embodiments provide a method to form a photolithography alignment mark structure for a double exposure type double patterning process, improving the alignment accuracy and the performance of the later-formed semiconductor structure.

Figure 1:
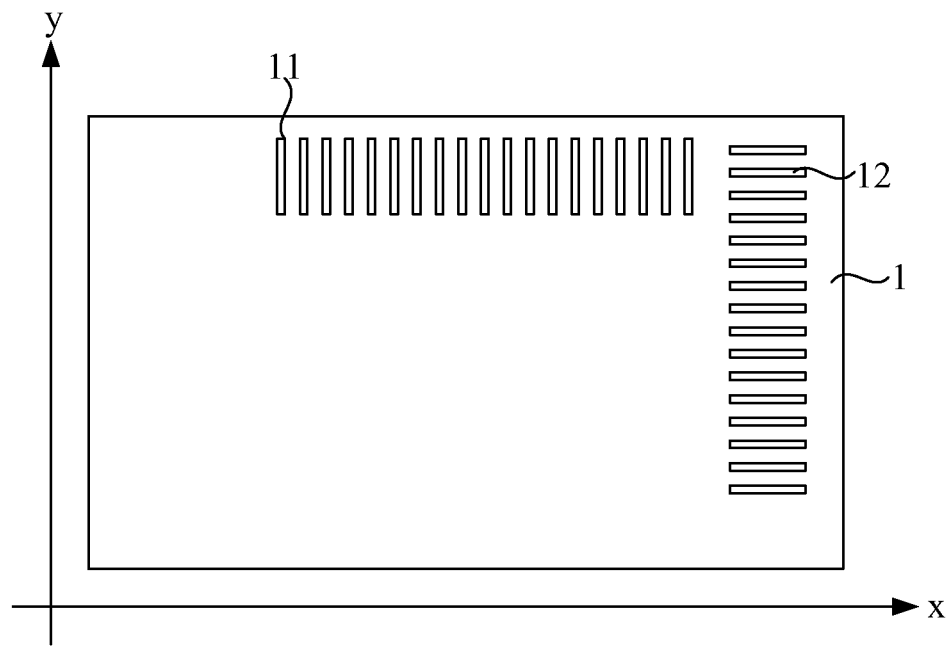
FIG. 1-4 illustrate schematic top views of semiconductor structures corresponding to certain stages of a current double exposure type double patterning process.
Figure 2:
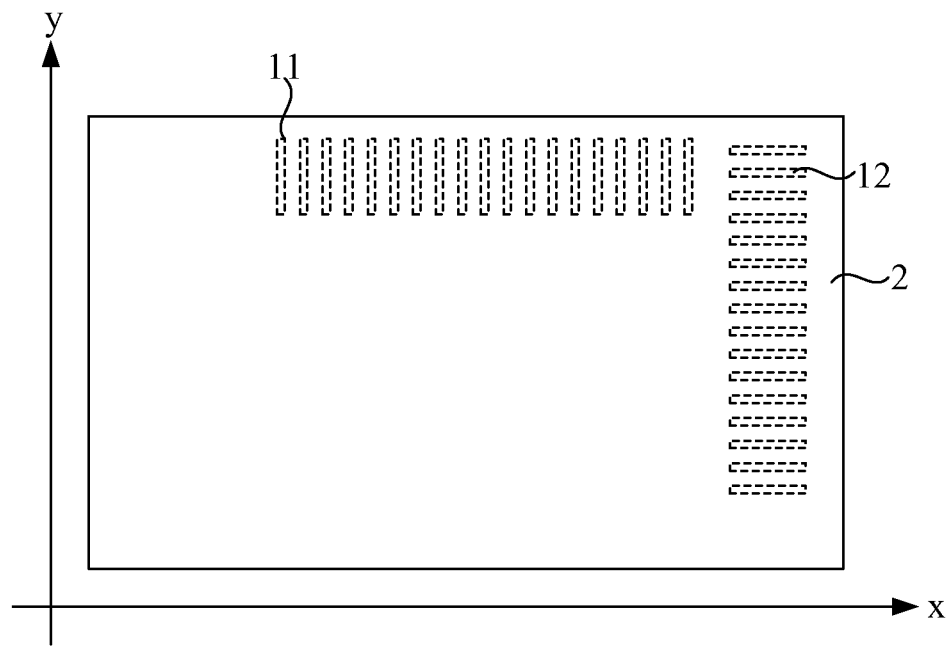
Figure 3:
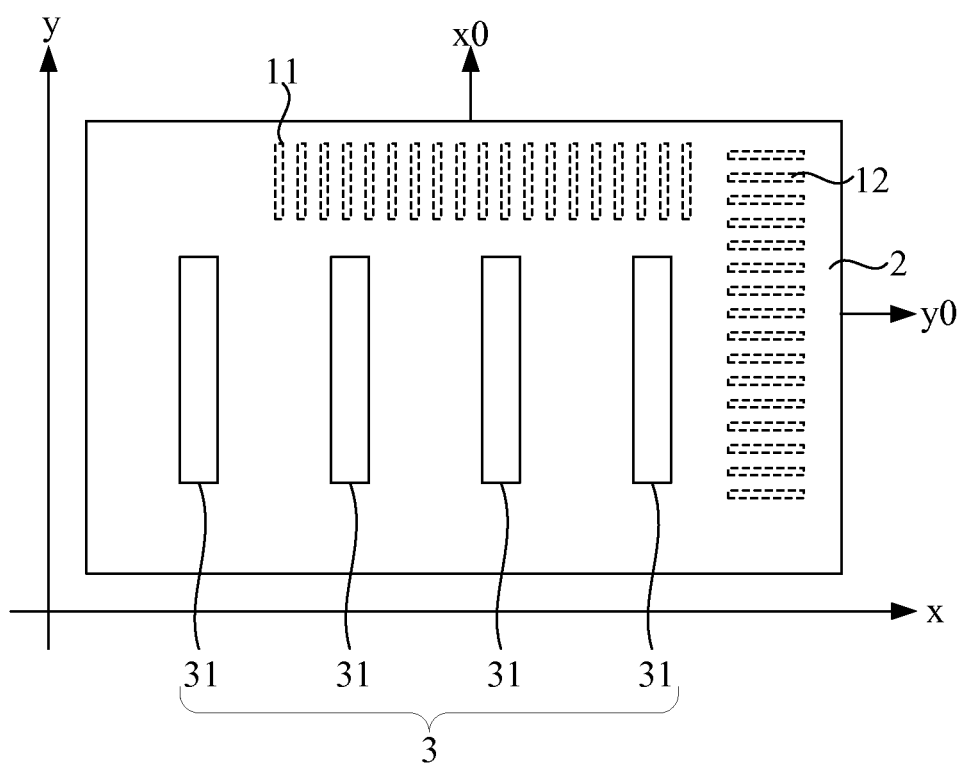
Figure 4:
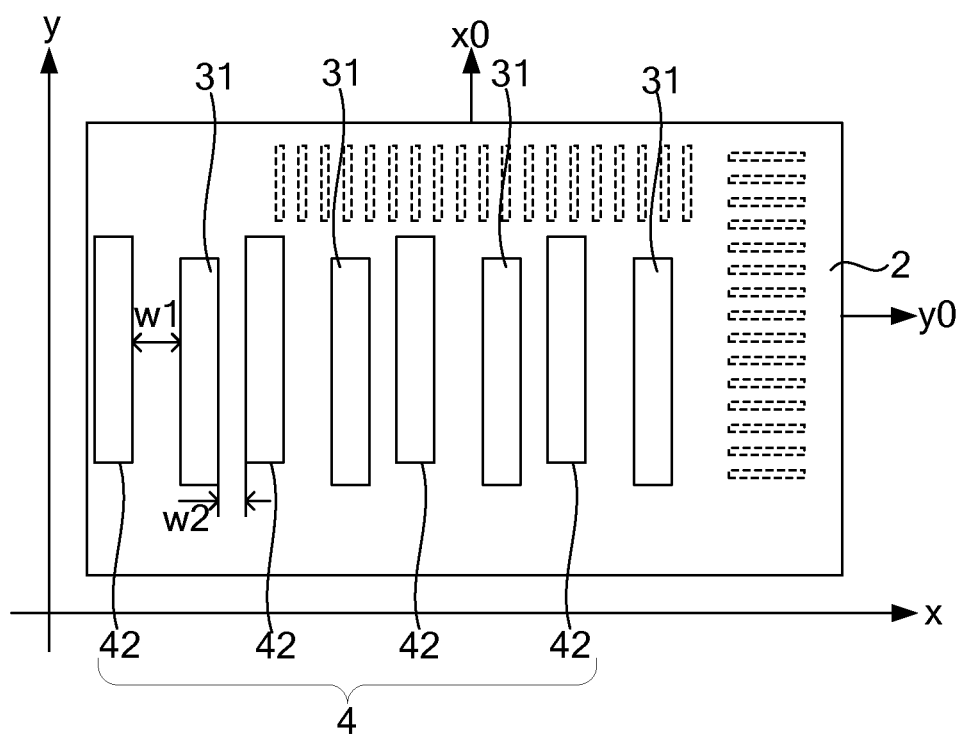
Figure 5:
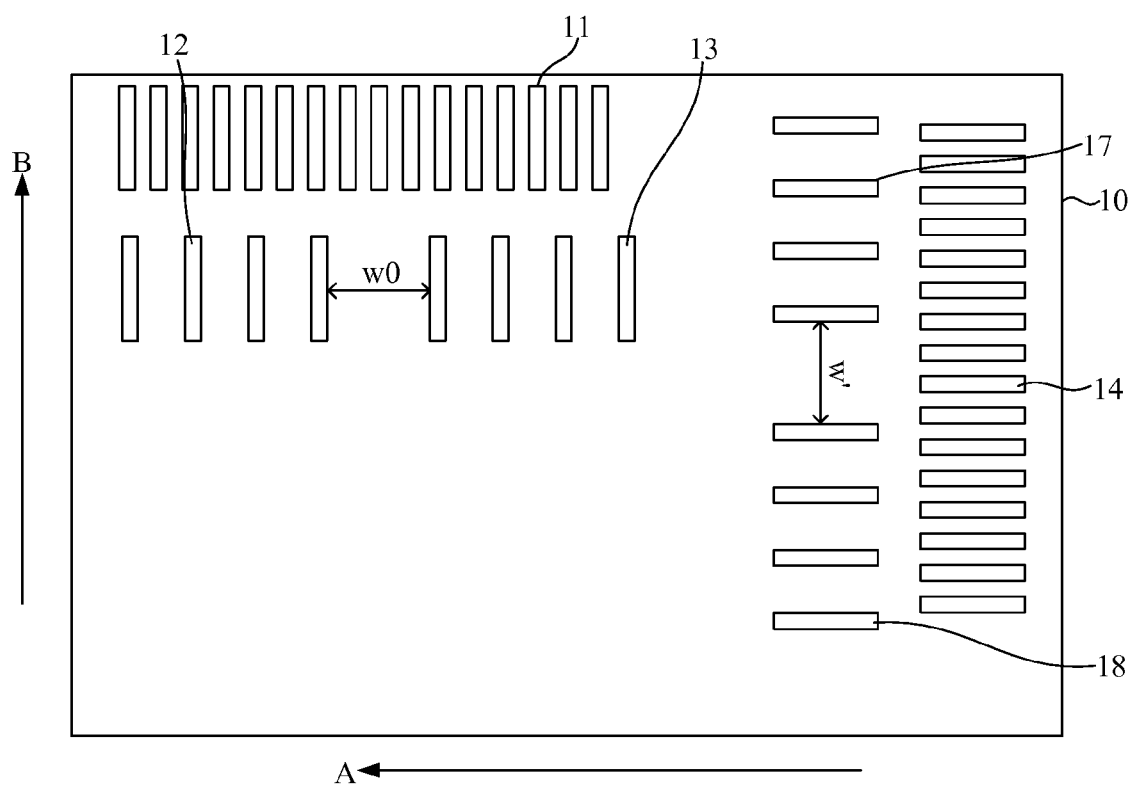
FIGS. 5-14 illustrate schematic views of photolithography alignment mark structures corresponding to certain stages of an exemplary fabrication process consistent with the disclosed embodiments.
Figure 15:
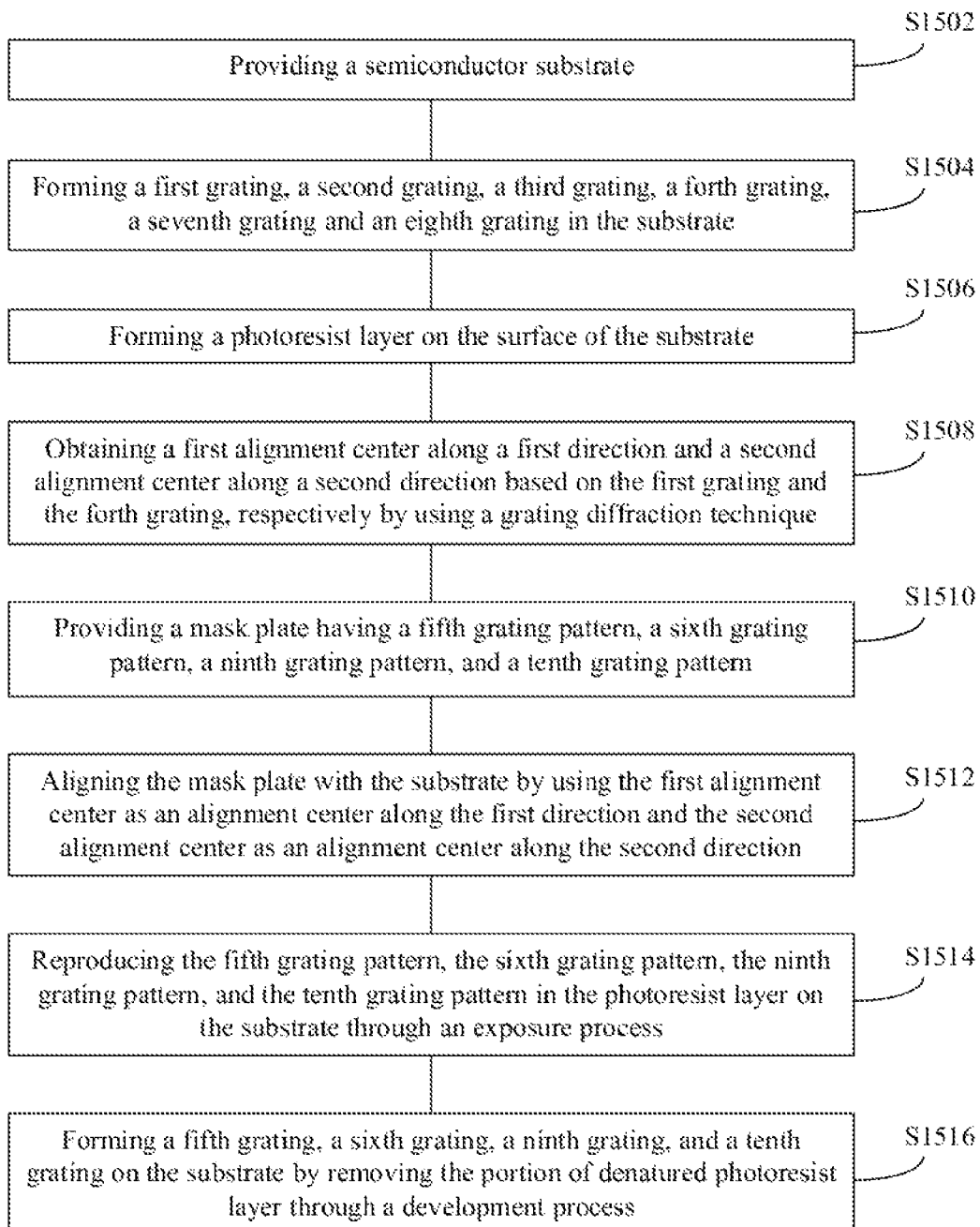
FIG. 15 illustrates an exemplary fabrication process of a lithography alignment mark structure in one embodiment of the present disclosure.

FIG. 15 illustrates an exemplary fabrication process of a lithography alignment of mark structure in one embodiment of the present disclosure. As shown in FIG. 15, at the beginning of the fabrication process for the photolithography alignment mark structure, a substrate 10 is provided (S1502). FIG. 5 shows a top view of the substrate.

In the one embodiment, the substrate 10 is made of silicon. In certain other embodiments, the substrate 10 may also be made of any other appropriate materials, such as germanium, silicon germanium, silicon on insulator (SIO), or germanium on insulator (GOI), etc.

In one embodiment, the substrate 10 is placed on a base station or a wafer stage. The base station has an x-y coordinate system. The x-y coordinates are used to mark the position of alignment center. A first direction 'A' is defined as along the x-axis while a second direction 'B' is defined as along the y-axis. In addition, the base station also has a reference mark. The reference mark is used to locate the position of the substrate 10 so that the position of the substrate 10 on the base station may be determined. In the following, description of an overlay shift occurred along the first direction 'A' during a photolithography process sets an example to illustrate the technical scheme of the present embodiment.

Referring to FIG. 5, a first grating 11, a second grating 12, and a third grating 13 are formed in the substrate 10 along the first direction 'A' (S1504). The grating constant of the first grating 11 is smaller than the grating constant of the second grating 12 while the grating constant of the second grating 12 is the same as the grating constant of the third grating 13. The grating constant of a given grating is the distance between any two neighboring reticles of the grating. The second grating 12 and the third grating 13 are spaced along the first direction 'A' and are arranged parallel to each other. The first grating 11 is spaced away from the second grating 12 and the third grating 13 along the second direction 'B'. A fourth grating 14, a seven grating 17, and an eighth grating 18 are formed in the substrate 10 along the second direction 'B'. The grating constant of the fourth grating 14 is smaller than the grating constant of the seventh grating 17 while the grating constant of the seventh grating 17 is the same as the grating constant of the eighth grating 18. The seventh grating 17 and the eighth grating 18 are spaced along the second direction 'B' and parallel to each other. The fourth grating 14 is spaced away from the seventh grating 17 and the eighth grating 18 along the first direction 'A'.

In any other embodiments, the relative position of the first grating 11, the second grating 12, and the third grating 13 may not be limited to the situation in the present embodiment and all the three gratings may be spaced either along the first direction 'A' or along the second direction 'B'. Correspondingly, the relative position of the fourth grating, the seventh grating, and the eighth grating may not be limited to the situation in the present embodiment and all the three ma be spaced either along the first direction 'A' or along the second direction 'B'.

In one embodiment, the first grating 11, the second grating 12, the third grating 13, the fourth grating 14, the seventh grating 17, and the eighth grating 18 are all scribe grooves and the scribe grooves may be formed by any appropriate techniques, such as mechanical scribing, holographic photolithography, e-beam lithography, laser interference lithography, focused ion-beam lithography, etc.

When a holographic photolithography technique is used, the fabrication process starts with coating the substrate with a layer of photoresist. After baking the photoresist, the substrate is placed into an interference optical system. Then an exposure process is performed. During the process, light waves passing through a mask plate (object wave) interference with a parallel light beam (reference beam) and the exposure leads to an interference fringe recorded on the photoresist layer. A portion of the photoresist layer exposed to interference lights with a relatively high intensity is denatured. After development, the portion of the denatured photoresist is then removed. Further, scribe grooves are formed by etching the substrate 10 and the scribe grooves are the reticles of the corresponding grating. Finally, the rest of the photoresist layer is removed.

When laser interference lithography technique is used, the laser interferometry uses the characteristics of optical interference and diffraction, and controls the distribution of light intensity in an interference field through a certain combination of light beams. The distribution of light intensity is then recorded by using a photosensitive material. A portion of the photoresist layer exposed to interference light with a relatively high intensity is denatured and thus a photolithography pattern is obtained. The pattern is then reproduced onto the substrate 10.

The scribe grooves may be formed by other techniques. For example, when an e-beam lithography or focused ion-beam lithography technique is used, electron beam e-beam) or focused ion-beam bombardment may be used to denature the property of a portion of the photoresist layer and thus define the lithography pattern.

In one embodiment, the grating constant of the second grating 12 is identical to that of the third grating 13. If the two grating constants are not the same, when forming a fifth grating corresponding to the second grating 12 and a sixth grating 16 corresponding to grating 13 in a subsequent process, the difference in the grating constant may be an obstructive factor during the formation of the fifth grating and the sixth grating. Specifically, the difference in the grating constant may cause the overlay shift of the fifth grating along the first direction 'A' with respect to the second grating 12 not equal to the overlay shift of the sixth grating along the first direction 'A' with respect to the third grating 13, thus leading to an inaccurate registration precision correction. Correspondingly, similar situation also applies to the seventh grating 17 and the eighth grating 18.

In one embodiment, the grating constant of the first grating 11 is the same as the grating constant of the fourth grating 14. However, the identical grating constant of the first grating 11 and the fourth grating 14 should not limit the scope of the present disclosure. In other embodiments, the grating constant of the first grating 11 may not be the same as the grating constant of the fourth grating. Correspondingly, whether the grating constant of the second grating is the same as the grating constant of the seventh grating 17 or not should not limit the scope of the present disclosure.

Referring to FIG. 5, the second grating 12 and the third grating 13 are arranged parallel to each other along the first direction 'A'. The spacing between the two gratings, w0, may be less than or equal to 100 μm. The spacing w0 refers to the distance between the two closest reticles with one from the second grating 12 and the other from the third grating 13 along the first direction 'A'. If the spacing between the second grating 12 and the third grating 13 is larger than 100 μm, a relatively large alignment error and a relatively large registration error may be induced during the formation of the fifth grating and the sixth grating, thus affecting the precision in adjusting the registration accuracy in the present embodiment. Correspondingly, the second grating 17 and the eighth grating 18 are arranged parallel to each other along the second direction B. The spacing between the two gratings is not greater than 100 μm. Further, the length relation between w0 and w' is not limited, w0 and w' may or may not have the same length.

Figure 6:
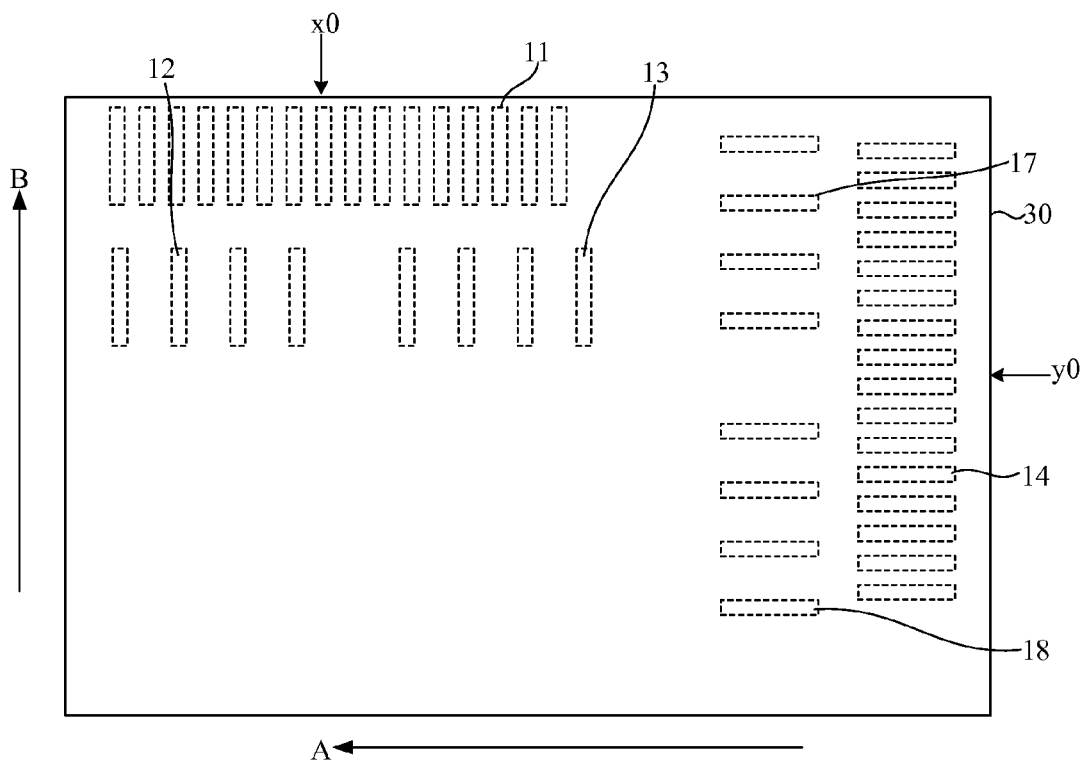

Returning to FIG. 15, after the formation of the gratings in the substrate 10 described above, a photoresist layer 30 is formed on the substrate 10 (S1506). FIG. 6 shows a to view of the structure. The photoresist layer 30 may be formed using any appropriate method.

Referring to FIG. 6, the photoresist layer 30 may be formed on the substrate 11 via a spin-coating process and may cover the substrate 11, the first grating 11, the second grating 12, the third grating 13, the fourth grating 14, the seventh grating 17, and the eighth grating 18. Moreover, because the first grating 11, the second grating 12, the third grating 13, the fourth grating 14, the seventh grating 17, and the eighth grating 18 are covered by the photoresist layer 30, the gratings cannot be seen in the top view, thus they are shown by dashed lines in the figure.

Referring to FIG. 15, after forming the photoresist layer 30, a first alignment center x0 is obtained using grating diffraction based on the first grating 11 along the first direction 'A', while a second alignment center y0 is also obtained using grating diffraction based on the fourth grating 14 along the second direction 'B' (S1508). FIG. 6 schematically indicates the positions of the two alignment centers x0 and y0.

Referring to FIG. 6, the alignment center x0 corresponds to a point on the x-axis of the x-y coordinates of the base station and the alignment center y0 corresponds to a point on the y-axis of the x-y coordinates of the base station.

As an example, a detailed description on determining x0 is now given to illustrate the process of locating an alignment center by using grating diffraction. First, a light beam is used to illuminate the first grating 11. The illumination light beam ma be a laser beam. Diffraction then occurs when the light beam passes through the first grating 11 and the diffracted light carries all the information about the first grating 11. The multi-level diffracted light spread out from the first grating 11 from different angles and an interference image is then formed on the reference plane by collecting the multi-level diffracted light through a spatial filter. A reference grating is placed symmetrically on the reference plane with respect to the center of the main optical axis of the illumination light beam. The reference grating and the first grating 11 have a same grating period. A corresponding probe optical fiber is placed behind the reference grating. The probe optical fiber guides the intensity signal of the light passing through the reference grating to a photoelectric conversion device. The photoelectric conversion device converts and processes the intensity signal of the light.

Figure 7:
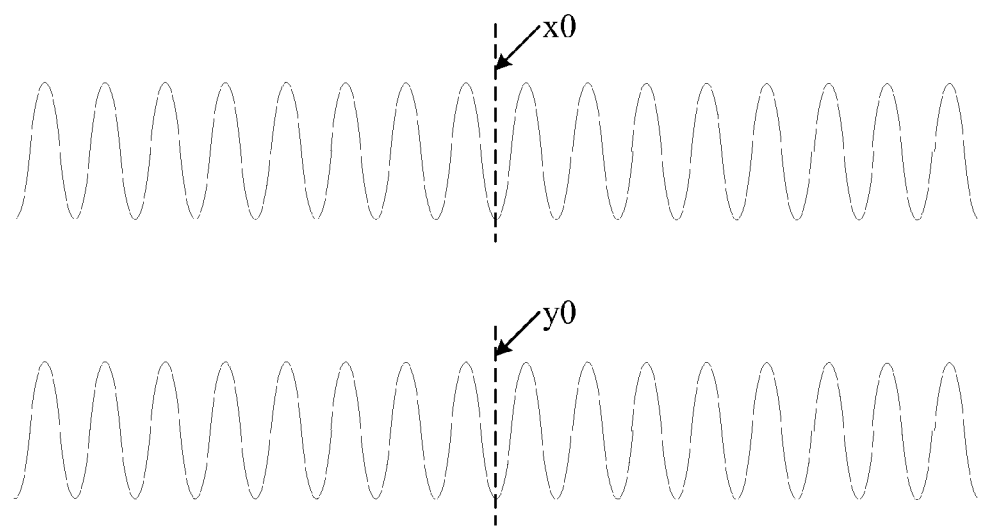

Referring to FIG. 7, based on the principle of Fourier optics, a sinusoidal signal corresponding to the intensity signal of the light with a certain period is generated in the detector. The period of the sinusoidal signal corresponds to the grating period, of the first grating 11 and the center of the sinusoidal signal is thus the position of the first alignment center x0. Using a similar method, another sinusoidal signal corresponding to the fourth grating 14 may be obtained. The second alignment center y0 corresponding to the fourth grating 14 may then be determined based on the sinusoidal signal.

Figure 8:
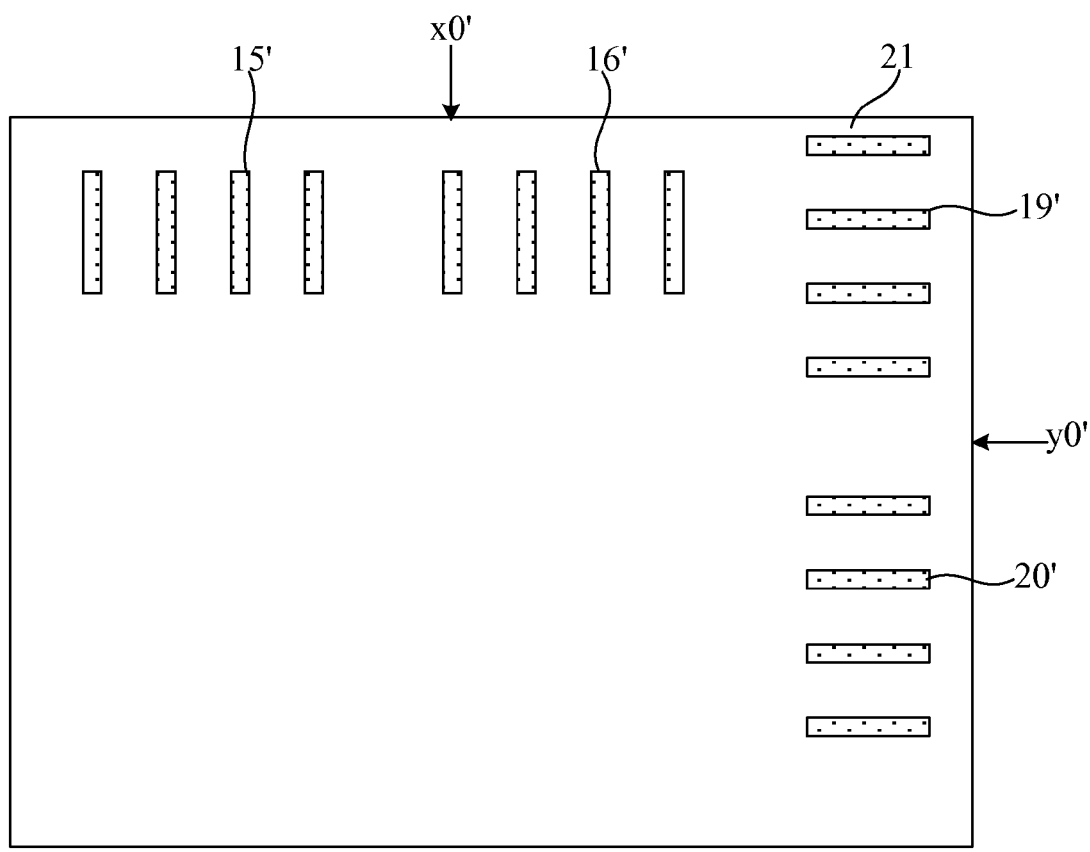

Referring to FIG. 15, further, a mask plate 21 is provided (S1510). FIG. 8 shows a schematic top view of the mask plate 21. Referring to FIG. 8, the mask plate has a fifth grating pattern 15', a sixth grating pattern 16', and a first reference mark x0' that corresponds to the first alignment center x0 and a ninth grating pattern 19', a tenth grating pattern 20', and a second reference mark y0' that corresponds to the second alignment center y0.

Figure 9:
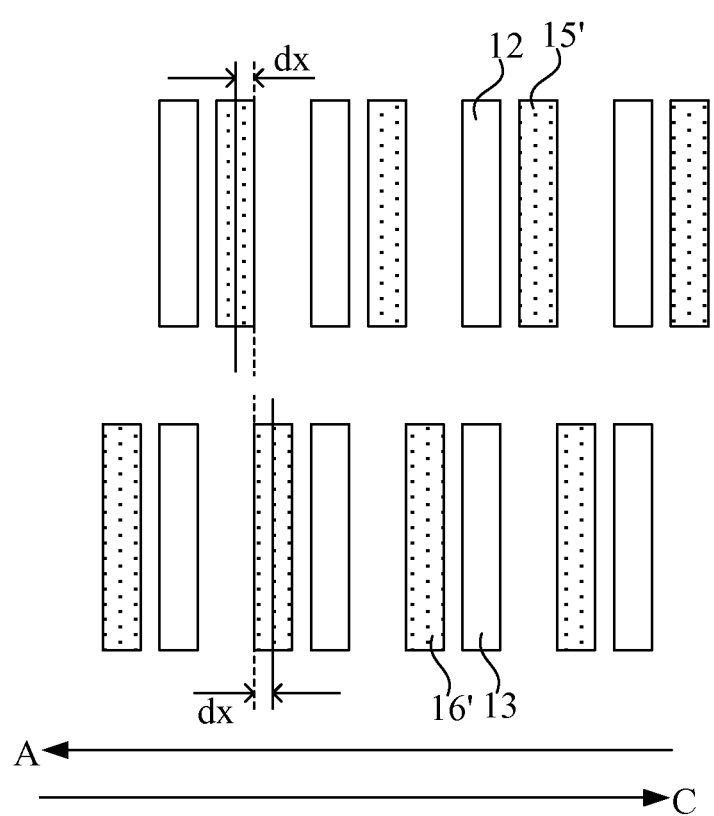

The mask plate 21 is used to define intended positions on the substrate 10 for the grating patterns on the mask plate 21. FIG. 9 shows a schematic view of the predesigned positional relationships between the fifth grating pattern 15' and the second grating 12 and between the sixth grating pattern 16' and the third grating 13.

According to the predesign shown in FIG. 9, the fifth grating pattern 15' has the same grating constant as the second grating 12 and the fifth grating pattern 15' is stacked against the second grating 12. That is the reticles of the fifth grating pattern 15' are interlaced with the reticles of the second grating 12. The fifth grating pattern 15' has an offset of a first distance dx along the first direction 'A' with respect to the second grating 12. That is, the center axis of a reticle of the fifth grating pattern 15' between two neighboring reticles of the second grating 12 has an offset of the first distance dx along the first direction 'A' with respect to the center line of the two neighboring reticles on the second grating 12.

Referring to FIG. 9, the sixth grating pattern 16' has the same grating constant as the third grating 13 and the sixth grating pattern 16' is stacked against the third grating 13. That is, the reticles of the sixth grating pattern 16' are interlaced with the reticles of the third grating 13. The sixth grating pattern 16' has an offset of a first distance dx along a third direction 'C' with respect to the third grating 13. The third direction 'C' is the opposite direction of the first direction 'A'. Therefore, the center axis of a reticle of the sixth grating pattern 16' between two neighboring reticles of the third grating 13 has an offset of the first distance dx along the third direction 'C' with respect to the center line of the two neighboring reticles on the third grating 13.

Figure 10:
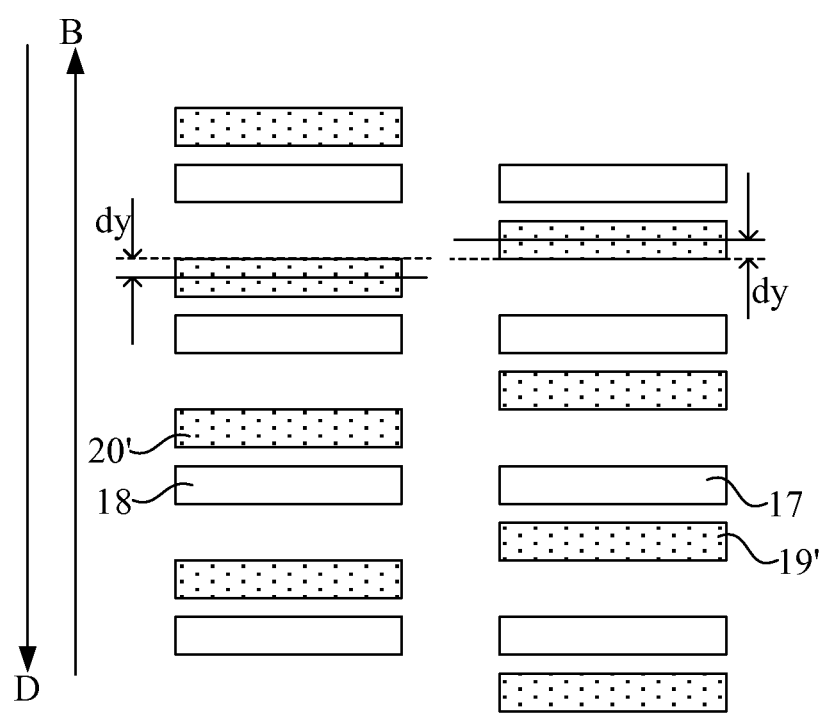

Accordingly, FIG. 10 shows a schematic view of the predesigned position relationships between the ninth grating pattern 19' and the seventh grating 17 and between the tenth grating pattern 20' and the eighth grating 18.

According to the predesign shown in FIG. 10, the ninth grating pattern 19' has the same grating constant as the seventh grating 17 and the ninth grating pattern 19' is stacked against the seventh grating 17. That is, the reticles of the ninth grating pattern 19' are interlaced with the reticles of the seventh grating 17. The ninth grating pattern 19' has an offset of a second distance dy along the second direction 'B' with respect to the seventh grating 17. That is, the center axis of a reticle of the ninth grating pattern 19' between two neighboring reticles of the seventh grating 17 has an offset of the second distance dy along the second direction 'B' with respect to the center line of the two neighboring reticles on the seventh grating 17.

Referring to FIG. 10, the tenth grating pattern 20' has the same grating constant as the eighth grating 18 and the tenth grating pattern 20' is stacked against the eighth grating 18. That is, the reticles of the tenth grating pattern 20' are interlaced with the reticles of the eighth grating 18. The tenth grating pattern 20' has an offset of a second distance dy along a fourth direction 'D' with respect to the eighth grating 18. The fourth direction is the opposite direction of the second direction 'B'. Therefore, the center axis of a reticle of the tenth grating pattern 20' between two neighboring reticles of the eighth grating 18 has an offset of the second distance dy along the fourth direction 'D' with respect to the center line of the two neighboring reticles on the eighth grating 18.

In one embodiment, the first distance dx may be predefined. Therefore, in a subsequent lithography process, the overlay shift information of a fifth grating along the first direction 'A' with respect to the second grating 12 and the overlay shift information of a sixth grating along the first direction 'A' with respect to the third grating 13 may also be increased. This makes the actual offset of the fifth grating with respect to the second grating 12 and the actual offset of the sixth grating with respect to the third grating 13 measurable. The first distance dx may be relatively small. For example, the first distance dx may be approximately in a range of 1 nm~10 nm. Therefore, overlay shifts of the fifth grating and the sixth grating may take place during a subsequent lithography process and the values of the overlay shifts depend linearly on dx, allowing linear addition or subtraction be performed on the offset of the alignment center in subsequent processes, thus ensuring the implementation of the method of the present embodiment.

Correspondingly, the second distance dy may also be predefined. Thus, in a subsequent lithography process, the overlay shift information of a ninth grating along the second direction 'B' with respect to the seventh grating 17 and the overlay shift information of a ninth grating alone the first direction 'A' with respect to the fluid grating 13 may also be increased.

Also referring to FIG. 15, further, an alignment process for the mask plate 21 is then performed on the top of the photoresist layer 30 (S1512). Specifically, the first reference mark x0' on the mask plate 21 is aligned with the first alignment center x0 while the second reference mark y0' on the mask plate 21 is aligned with the second alignment center y0, thus the position of the mask plate 21 with respect to the base station is then determined. The alignment lets the fifth grating pattern 15' be aligned with the second grating 12 along a direction perpendicular to the top surface of the photoresist layer 30 and the sixth grating pattern 16' be aligned with the third grating 13 along the direction perpendicular to the top surface of the photoresist layer 30. The alignment also simultaneously lets the ninth grating pattern 19 be aligned with the seventh grating 17 along the direction perpendicular to the top surface of the photoresist layer 30 and tenth grating pattern 20' be aligned with the eighth grating 18 along the direction perpendicular to the top surface of the photoresist layer 30.

Figure 11:
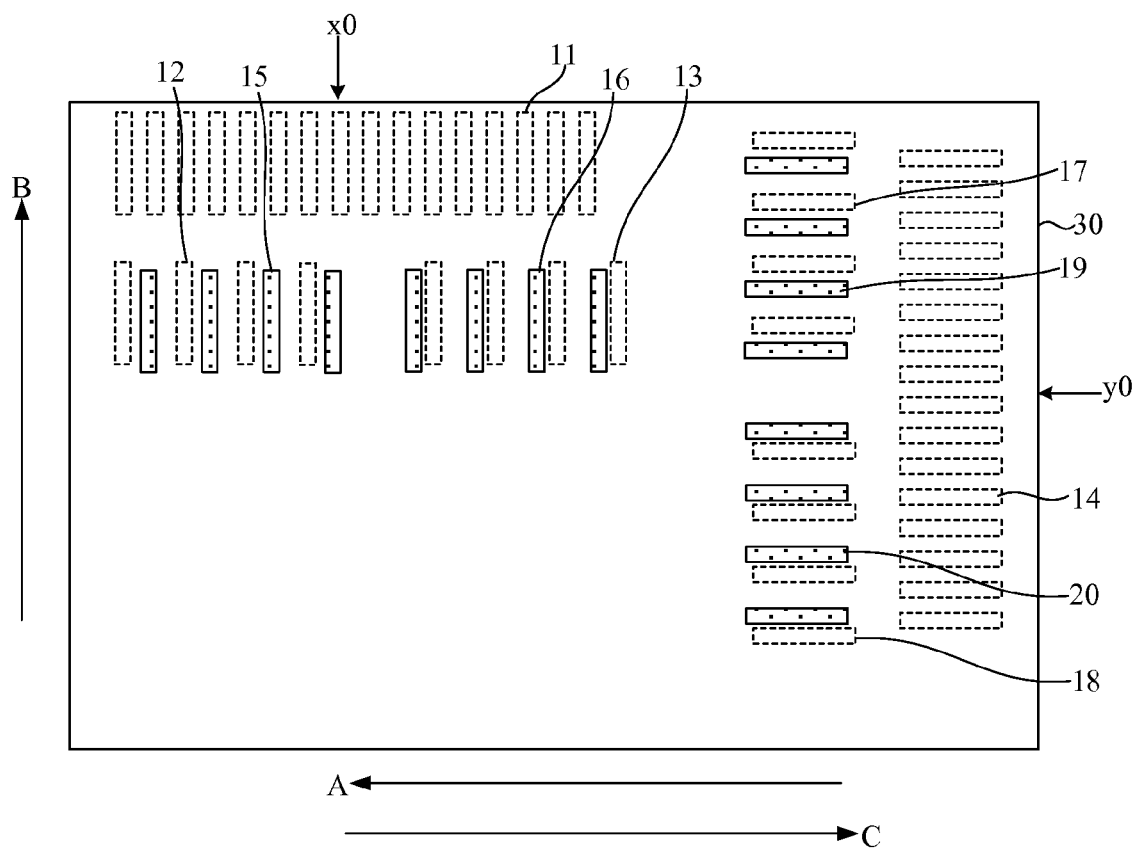

Further, referring to FIG. 15, an exposure process is performed after the mask plate 21 is aligned (S1514). FIG. 11 shows a schematic top view of the structure of the substrate after the exposure process. Referring to FIG. 11, the fifth grating pattern 15' is reproduced in the photoresist layer 30 to define a fifth grating 15, the sixth grating pattern 16' is reproduced in the photoresist layer 30 to define a sixth grating 16, the ninth grating pattern 19' is reproduced in the photoresist layer 30 to define a ninth grating 19, and the tenth grating pattern 20' is reproduced in the photoresist layer 30 to define a tenth grating 20. Due to the influence of the lithography equipment and other factors, the fifth grating 15 with respect to the second grating 12 and the sixth grating with respect to the third grating 13 may have an overlay shift along the first direction 'A', or equivalently along the third direction 'C'. In one embodiment, the direction of the overlay shift is along the third direction 'C'. During the photolithography process, the fifth grating 15 with respect to the second grating 12 and the sixth grating 16 with respect to the third grating 13 may have an additional overlay shift Δx (not shown) along the first direction 'A' corresponding to the focus depth of the photolithography apparatus.

Accordingly, the ninth grating 19 with respect to the seventh grating 17 and the tenth grating with respect to the eighth grating 18 may have an overlay shift along the second direction 'B', or equivalently along the fourth direction 'D'. In one embodiment, the direction of the overlay shift is along the fourth direction 'D'.

Returning back to FIG. 9, because the predefined fifth grating pattern 15' has an onset along the first direction 'A' with respect to the second grating 12 while the sixth grating pattern has an offset along the third direction 'C' with respect to the third grating 13. Therefore, after exposure, referring to FIG. 11, the fifth grating 15 has an offset along the first direction 'A' with respect to the second grating 12 while the sixth grating 16 has an offset along the third direction 'C' with respect to the third grating 13. Correspondingly, the ninth grating 19 has an offset along the second direction 'B' with respect to the seventh grating 17 while the tenth grating 20 has an offset along the fourth direction 'D' with respect to the eighth grating 18. Also, both the fifth grating 15 with respect to the second grating 12 and the sixth grating 1 with respect to the third grating 13 may have another overlay shift Δy (not shown) along the second direction 'B' corresponding to the focus depth of the photolithography apparatus.

Figure 12:
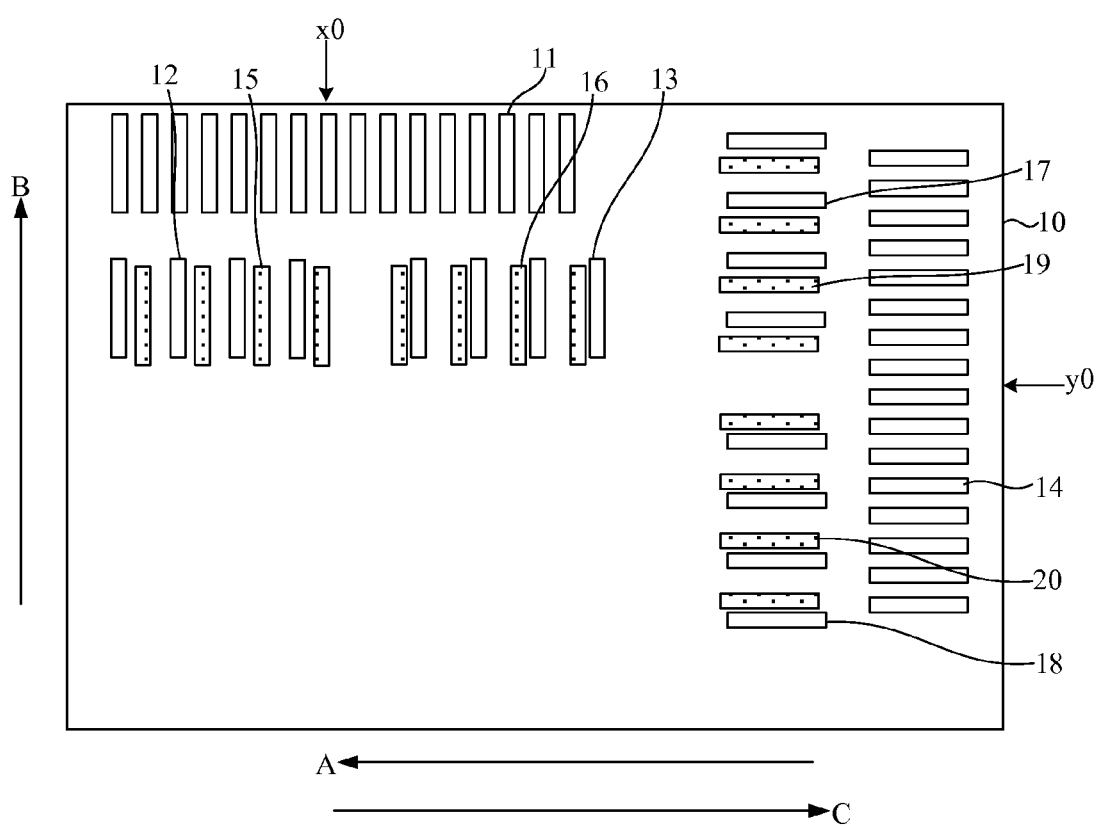

Finally, also referring to FIG. 15, a development process is performed to remove the denatured portion of photoresist layer (S1516). After the development process, the photoresist layer except for the fifth grating 15, the sixth grating 16, the ninth grating 19, and the tenth grating 20 is removed and the surface of the substrate 10 is exposed. FIG. 12 shows a schematic view of the structure after the development process.

Accordingly, the photolithography alignment mark structure includes the first grating 11, the second grating 12, the third grating 13, the fourth grating 14, the seventh grating 17, and the eighth grating 18 formed in the substrate 10 and the fifth grating 15, the sixth grating 16, the ninth grating 19, and the tenth grating 20 formed on the surface of the substrate 10.

Figure 13:
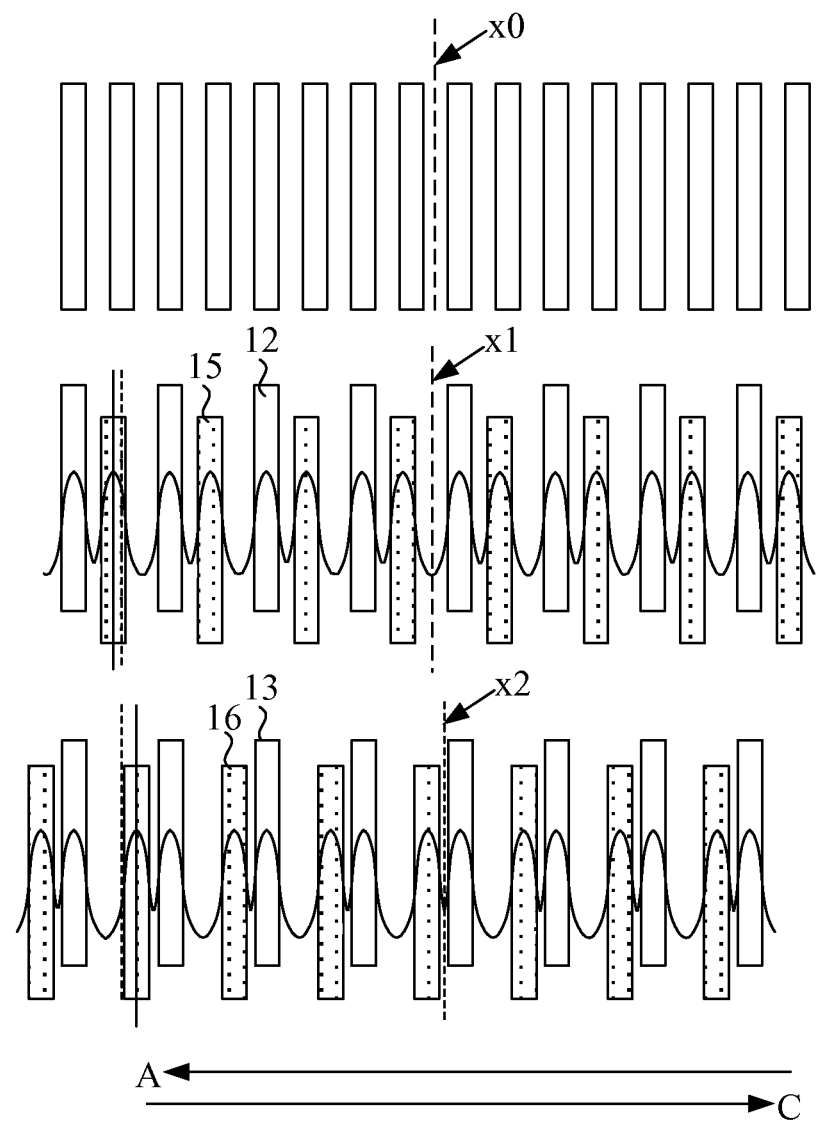

Referring to FIG. 13, with the photolithography alignment mark structure, a third alignment center x1 of a grating that consists of the second grating 12 and the fifth grating 15 and a fourth alignment center x2 of a grating that consists of the third grating 13 and the sixth grating 16 may be obtained by using grating, diffraction. The reference grating used in the process includes a first segment corresponding to the first grating 11, a second segment corresponding to the grating formed by the second grating 12 and the fifth grating 15, and a third segment corresponding to the grating formed by the third grating 13 and the sixth grating 16. A probe optical fiber is placed behind of each of the segments to collect the intensity signal of the light passing through the reference gratings.

Correspondingly, refining to FIG. 13, a fifth alignment center y1 of a grating that consists of the seventh grating 17 and the ninth grating 19 and a sixth alignment center y2 of a grating that consists of the eighth grating 18 and the tenth grating 20 may be obtained by using grating diffraction. The reference grating used in the process includes a first segment corresponding to the fourth grating 14, a second segment corresponding to the grating formed by the seventh grating 17 and the ninth grating 19, and a third segment corresponding to the grating formed by the eighth grating 18 and the tenth grating 20. A probe optical fiber is placed behind of each of the segments to collect the intensity signal of the light passing through the reference gratings.

Returning, back to FIG. 7, because of the first distance dx and the overlay shift Δx, the third alignment center x1 has an offset with respect to the first alignment center x0 while the fourth alignment center x2 also has an offset with respect to the first alignment center x0. In addition, because the first distance dx is relatively small, the overlay shift Δx and the first distance dx have a linear relationship, the offset of the third alignment center x1 with respect to the first alignment center x0 corresponds to but is not equal to −(dx+Δx) while the offset of the fourth alignment center x2 with respect to the first alignment center x0 corresponds to but is not equal to dx+Δx. The minus sign wherein indicates that the offset is along, the third direction 'C'.

Accordingly, because the second distance dy is relatively small, the overlay shift Δy and the second distance dy have a linear relationship, the offset of the fifth alignment center y1 with respect to the second alignment center y0 corresponds to but is not equal to −(dy+Δy) while the offset of the sixth alignment center y2 with respect to the second alignment center y0 corresponds to but is not equal to dy+Δy. The minus sign wherein indicates that offset is along the fourth direction 'D'.

In one embodiment, the first grating 11, the grating formed by the second grating 12 and the fifth grating 15, and the grating formed by the third grating 13 and the sixth grating 16 are used as alignment marks along, the first direction 'A'; the fourth grating 14, the grating formed by the seventh grating 17 and the ninth grating 19, and the grating formed by the eighth grating 18 and the tenth grating 20 are used as alignment marks along the second direction 'B'.

The photolithography alignment mark structure of the embodiments of the present disclosure may then be used in a double exposure type double patterning process to improve the alignment accuracy. Specifically, a double exposure type double patterning process using the photolithography alignment mark structure disclosed in the embodiments may include the following steps:

First, during the first exposure, the first alignment center x0 is used as the alignment center along the first direction 'A' and the second alignment center y0 is used as the alignment center along the second direction 'B'. After the first exposure, the first device pattern has an alignment offset with respect to the intended position on the substrate.

Figure 14:
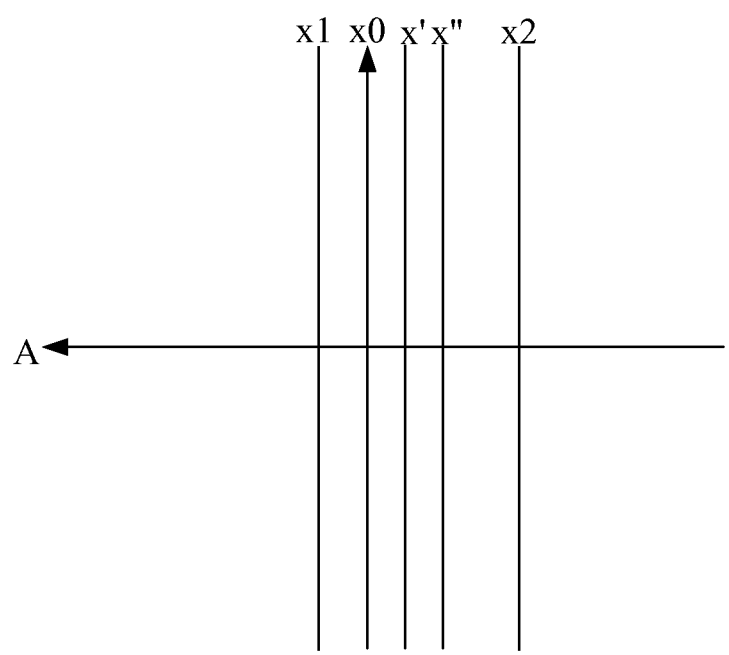

Further, the alignment center along the first direction 'A' for the second exposure may be adjusted based on the third alignment center x1 and the fourth alignment center x2. Referring to FIG. 14, because of the linear relationship between the first distance dx and the overlay shift Δx, linear operation may be performed by using the third alignment center x1 and the fourth alignment center x2: first, the center position between the third alignment center x1 and the fourth alignment center x2 may be calculated and the result is x"=(x1+x2)/2. The value of x" is regarded as the actual offset value of the first device pattern with respect to the intended position on the substrate after the first exposure; then, based on the offset value of the first device pattern with respect to the substrate after the first exposure, an average value of the offset of x" with respect to the first alignment center x0 may be calculated and the average value is (x"−x0)/2; then, an alignment center x'=x0+(x"−x0)/2=(x"+x0)/2=((x1+x2)/2+x0)/2 may be used for the second exposure. That is, during the second exposure process, the first alignment center x0 is no longer used as the alignment center; instead, the adjusted position x' is used as the alignment center.

By choosing the center position x' between x" and x0 as the new alignment center, after the second exposure, the alignment error of the actual position of the second device pattern along the first direction 'A' with respect to the intended position of the second device pattern on the substrate may be reduced. In the meantime, the registration error between the second device pattern and the first device pattern may also be reduced. Thus, the alignment error between the intended position of the second device pattern and the actual position formed on the substrate after the second exposure may be reduced due to compensation, and the registration offset value of the second device pattern with respect to the first device pattern may also be reduced. Therefore, the registration accuracy of the second device pattern with respect to the first device pattern may be greatly improved, e.g., about 40%. The improvement may not only ensure that subsequent semiconductor manufacturing processes can be normally performed but also ensure that the semiconductor structure containing the second device pattern and the first device pattern has good performance.

In addition, during the second exposure, the alignment center of the second exposure along the second direction 'B' may also be adjusted based on the fifth alignment center y1 and the sixth alignment center y2. Referring to the above description, the alignment center of the second exposure along, the second direction 'B' after the adjustment is y'=((y1+y2)/2+y0)/2. Using the adjusted alignment center y', after the second exposure, the alignment error between the actual position of the second device pattern and the intended position of the second device pattern on the substrate along the second direction 'B' may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a photolithography alignment mark structure, comprising:
    providing a semiconductor substrate;
    forming a first grating, a second grating, a third grating and a fourth grating in the substrate;
    forming a photoresist layer on a surface of the substrate;
    obtaining a first alignment center along a first direction and a second alignment center along a second direction based on the first grating and the fourth grating, respectively, by using grating diffraction;
    providing a mask plate having a fifth grating pattern and a sixth grating pattern on the mask plate;
    aligning the mask plate with the substrate by using the first alignment center as an alignment center along the first direction and the second alignment center as an alignment center along the second direction, wherein reticles of the second grating are interlaced with reticles of the fifth grating pattern, and the fifth grating pattern has an offset of a first distance along the first direction with respect to the second grating; and reticles of the third grating are interlaced with reticles of the sixth grating pattern, and the sixth grating pattern has an offset of the first distance along a reverse direction of the first direction with respect to the third grating;
    reproducing the fifth grating pattern and the sixth grating pattern in the photoresist layer on the substrate through an exposure process; and
    forming a fifth grating and a sixth grating on the surface of the substrate by removing a portion of photoresist layer.

2. The method according to claim 1, wherein the substrate may be made of any appropriate semiconductor materials including silicon, germanium, silicon germanium, silicon on insulator (SIO), or germanium on insulator (GOI), etc.

3. The method according to claim 1, wherein the first distance is in a range of 1 nm~10 nm.

4. The method according to claim 1, wherein the second grating and the third grating are arranged parallel to each other along the first direction and a distance between the second grating and the third grating is not greater than 100 µm.

5. The method according to claim 1, wherein:
the first grating, the second grating, the third grating, the fourth grating, the fifth grating, and the sixth grating together are used as the photolithography alignment mark structure.

6. The method according to claim 5, wherein:
the first grating, the second grating, and the third grating in the substrate are formed along the first direction;
the fourth grating in the substrate is formed along the second direction;
the first direction and the second direction are perpendicular to each other;
the fifth grating pattern and the sixth grating pattern on the mask plate are formed along the first direction;
the grating constant of the first grating is smaller than the grating constant of the second grating; and
the second grating, the third grating, the fifth grating pattern, and the sixth grating pattern have a same grating constant.

7. The method according to claim 1, wherein:
during the formation of the first grating, the second grating, the third grating, and the fourth grating in the substrate, a seventh grating and an eighth grating are also formed in the substrate along the second direction;
the mask plate also has a ninth grating pattern and a tenth grating pattern along the second direction;
after the mask plate is aligned with the substrate, reticles of the seventh grating are interlaced with reticles of the ninth grating pattern, and the ninth grating pattern has an offset of a second distance along the second direction with respect to the seventh grating; and
reticles of the eighth grating are interlaced with reticles of the tenth grating pattern, and the tenth grating pattern has an offset of the second distance along a reverse direction of the second direction with respect to the eighth grating.

8. The method according to claim 7, wherein:
during an exposure process, the ninth grating pattern and the tenth grating pattern on the mask plate are also reproduced in the photoresist layer on the substrate simultaneously with the fifth grating pattern and the sixth grating pattern;
during formation of the fifth grating and the sixth grating on the substrate, a ninth grating and a tenth grating are also formed on the substrate along the second direction; and
the photolithography alignment mark structure also includes the seventh grating, the eighth grating, the ninth grating, and the tenth grating.

9. A method for fabricating semiconductor structures using a photolithography alignment mark structure, comprising:
providing a semiconductor substrate having the photolithography alignment mark structure;
forming a device layer on the surface of the substrate to cover the substrate and the photolithography alignment mark structure;
forming a photoresist layer on the surface of the device layer;
using grating diffraction to obtain a first alignment center $x0$ along a first direction based on a first grating, a third alignment center $x1$ along the first direction based on a second grating and a fifth grating, and a fourth alignment center $x2$ along the first direction based on a third grating and a sixth grating;
performing a first exposure to define a first device pattern in the photoresist layer by using the first alignment center $x0$ as an alignment center along the first direction for the alignment prior to the first exposure process, wherein the first device pattern includes a number of parallel first strip lines along the first direction; and
performing a second exposure to define a second device pattern in the photoresist layer by using a point $x'=((x1+x2)/2+x0)/2$ as the alignment center along the first direction for the alignment prior to the second exposure process, wherein the second device pattern includes a number of parallel second strip lines along the first direction, and the second strip lines are interlaced with the first strip lines.

10. The method according to claim 9, further including:
removing the photoresist layer except for the first device pattern and the second device pattern to form a patterned photolithography layer; and
using the patterned photolithography layer as a mask to etch the device layer until a surface of the substrate is exposed.

11. The method according to claim 9, wherein a second alignment center $y0$ is obtained based on the fourth grating using grating diffraction, wherein the second alignment center $y0$ is used as an alignment center along the second direction for both the first exposure process and the second exposure process.

12. The method according to claim 9, wherein the photolithography alignment mark structure also includes a seventh grating and an eighth grating in the substrate along the second direction and a ninth grating and a tenth grating on the substrate along the second direction, and the method further includes:
prior to the first exposure process, by using grating diffraction, obtaining a second alignment center $y0$ along the second direction based on the fourth grating, a fifth alignment center $y1$ along the second direction based on the seventh grating and the ninth grating, and a sixth alignment center $y2$ along the second direction based on the eighth grating and the tenth grating;
the second alignment center $y0$ is used as an alignment center along the second direction for the alignment prior to the first exposure; and
an alignment center $y'=((y1+y2)/2+y0)/2$ is used as an alignment center along the second direction for the alignment prior to the second exposure.

* * * * *